US010164188B2

United States Patent
Ocola et al.

(10) Patent No.: US 10,164,188 B2
(45) Date of Patent: Dec. 25, 2018

(54) POLYMER-HYBRID ELECTRO-OPTIC DEVICES AND METHOD OF FABRICATING POLYMER-HYBRID ELECTRO-OPTIC DEVICES

(71) Applicant: UCHICAGO ARGONNE, LLC, Chicago, IL (US)

(72) Inventors: Leonidas E. Ocola, Oswego, IL (US); David J. Gosztola, Naperville, IL (US); Angel Yanguas-Gil, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 15/433,659

(22) Filed: Feb. 15, 2017

(65) Prior Publication Data

US 2018/0233666 A1    Aug. 16, 2018

(51) Int. Cl.
*H01L 51/00*    (2006.01)
*H01L 51/44*    (2006.01)
*H01L 51/42*    (2006.01)

(52) U.S. Cl.
CPC ........ *H01L 51/002* (2013.01); *H01L 51/0018* (2013.01); *H01L 51/441* (2013.01); *H01L 51/4266* (2013.01)

(58) Field of Classification Search
None
See application file for complete search history.

(56) References Cited

U.S. PATENT DOCUMENTS 8,980,418 B2    3/2015    Darling et al.
2011/0068332 A1*  3/2011  Han ................... H01L 29/4908
                                               257/40

OTHER PUBLICATIONS

Choi, et al., "Electroluminescence from Localized Defects in Zinc Oxide: Toward Electrically Driven Single Photon Sources at Room Temperature," ACS Applied Materials & Interfaces 7(10), pp. 5619-5623 (2015).
Cui & Gibson, "Low-temperature fabrication of single-crystal ZnO nanopillar photonic bandgap structures," Nanotechnology 18(15), 155302, 6 pages (2007).
Gong, et al., "Sequential Vapor Infiltration of Metal Oxides into Sacrificial Polyester Fibers: Shape Replication and Controlled Porosity of Microporous/Mesoporous Oxide Monoliths," Chemistry of Materials 23, pp. 3476-3485 (2011).
Huang, et al., "Low-Temperature Growth of SnO2 Nanorod Arrays and Tunable n-p-n Sensing Response of a ZnO/SnO2 Heterojunction for Exclusive Hydrogen Sensors," Advanced Functional Materials 21(14), pp. 2680-2686 (2011).

(Continued)

*Primary Examiner* — Michelle Mandala
(74) *Attorney, Agent, or Firm* — Foley & Lardner LLP

(57) ABSTRACT

A polymer-hybrid electro-optic device is fabricated by providing a semiconductor substrate, depositing a metal electrode layer on the semiconductor substrate, depositing a dielectric barrier core layer within a gap of the metal electrode layer, patterning a polymer layer to cover the dielectric barrier core layer and partially covering the metal electrode layer, infiltrating the polymer layer with an inorganic component to form a hybrid oxide-polymer layer, and removing excess inorganic component from the semiconductor substrate and metal electrode layer.

15 Claims, 8 Drawing Sheets

(56) References Cited

OTHER PUBLICATIONS

Inamdar & Rajpure, "High-performance metal—semiconductor-metal UV photodetector based on spray deposited ZnO thin films," Journal of Alloys and Compounds 595, pp. 55-59 (2014).

Lee, et al., "ZnO-based resonant cavity enhanced metal—semiconductor-metal ultraviolet photodetectors," Solid-State Electronics 79, pp. 223-226 (2013).

Min, et al., "Inductively coupled plasma reactive ion etching of ZnO films in HBr/Ar plasma," Thin Solid Films 516(11), pp. 3521-3529 (2008).

Nam, C., et al., "Electrical and structural properties of ZnO synthesized via infiltration of lithographically defined polymer templates," Applied Physics Letters, 107, 203106 (2015), pp. 1-5.

Peng, et al., "Nanoscopic Patterned Materials with Tunable Dimensions via Atomic Layer Deposition on Block Copolymers," Advanced Materials 22(45), pp. 5129-5133 (2010).

Tian, et al., "Effects of continuous annealing on the performance of ZnO based metal-semiconductor-metal ultraviolet photodetectors," Materials Science and Engineering B 184, pp. 67-71 (2014).

Tseng, et al., "Enhanced Block Copolymer Lithography Using Sequential Infiltration Synthesis," the Journal of Physical Chemistry C 115, pp. 17725-17729 (2011).

\* cited by examiner

P-type electrodes

Interdigitated electrodes

POLYMER-HYBRID ELECTRO-OPTIC DEVICES AND METHOD OF FABRICATING POLYMER-HYBRID ELECTRO-OPTIC DEVICES

STATEMENT OF GOVERNMENT INTEREST

The United States Government claims certain rights in this invention pursuant to Contract No. DE-AC02-06CH11357 between the U.S. Department of Energy and U. Chicago Argonne, LLC, as operator of Argonne National Laboratories.

FIELD OF THE INVENTION

The present invention relates generally to the field of fabricating polymer-hybrid electro-optic devices.

BACKGROUND

This section is intended to provide a background or context to the invention recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

The optoelectronic properties of metal oxides, such as zinc oxide (ZnO), make them promising candidates for use in photovoltaic devices, field emission devices, and sensors (gas, UV, and biological). For example, zinc oxide is a multifunctional semiconducting material with a direct, wide bandgap energy of 3.4 eV, which makes it transparent in visible light (ZnO absorbs in the ultraviolet (UV) to blue wavelengths). Additionally, ZnO has a resistivity that may be tuned from a semi-insulating material to semi-metallic material by known doping techniques and one of the highest piezoelectric response times of any semiconductor. Thus, thin film and bulk ZnO materials have been explored for various applications in electronics, optics, photonics, and biologics.

Conventional techniques for fabricating ZnO-based devices involve nanowire growth, nanoparticles, and thin films. ZnO nanowires are semiconducting particles having a high aspect ratio, with cross-sectional diameters less than 1 μm, and lengths as long as tens of microns. Aside from problems in fabricating ZnO nanowires as a material, which include catalytic poisoning, precursor degradation, and isotropic growth, ZnO nanowire-based devices also suffer from requiring specialized substrate treatments, needing both a top and bottom electrode, limited growth geometries, and customized topologies which make ZnO nanowire growth challenging.

ZnO nanoparticle-based devices face similar setbacks in optoelectronic applications, suffering from unreliable electrical contacts due to self-assembling positional arrangements of the nanoparticles, a need for both a top and bottom electrode, and difficulties in integrating nanoparticle materials in large arrays. A third alternative for integrating ZnO into optoelectronic applications is by thin film deposition, typically using expensive semiconductor tools, and techniques such as physical vapor deposition (PVD), chemical vapor deposition (CVD), pulsed-laser deposition, molecular beam epitaxy, spray-pyrolysis, and electro-chemical deposition techniques. Devices based on ZnO thin films often require special substrates, are limited to top electrode configurations, and are limited in application. For example, ZnO thin films are not easily compatible for photonic devices.

A need exists for improved technology, including polymer-hybrid electro-optic devices and a method of fabricating the polymer-hybrid electro-optic device.

SUMMARY

One embodiment of the invention relates to a method of fabricating an electro-optic device. The method includes providing a semiconductor substrate, depositing a metal electrode layer on the semiconductor substrate, depositing a dielectric barrier core layer within a gap of the metal electrode layer, patterning a polymer layer to cover the dielectric barrier core layer and partially covering the metal electrode layer, infiltrating the polymer layer with an inorganic component to form a hybrid oxide-polymer layer, and removing excess inorganic component from the semiconductor substrate and metal electrode layer.

In one embodiment, following the step of infiltrating, annealing the hybrid oxide-polymer layer in an oxygen-rich atmosphere. In one embodiment, the step of infiltrating comprises exposing the polymer layer to at least one cycle of a metal-containing precursor followed by a second precursor. In one embodiment, the metal-containing precursor comprises trimethyl aluminum (TMA), titanium tetrachloride ($TiCl_4$), diethyl zinc (DEZ), or tungsten hexafluoride ($WF_6$). In one embodiment, the second precursor comprises an oxygen source, the oxygen source comprising $H_2O$, $O_2$, $O_3$, or $H_2O_2$. In one embodiment, the second precursor comprises a reducing agent, the reducing agent comprising $H_2$, $H_2S$, $H_2S_2$, or $Si_2H_6$. In one embodiment, the inorganic component comprises aluminum oxide ($Al_2O_3$), titanium oxide ($TiO_2$), zinc oxide (ZnO), silicon dioxide ($SiO_2$), hafnium dioxide ($HfO_2$), zirconium dioxide ($ZrO_2$), magnesium oxide (MgO), tin oxide (SnO) or tungsten (W). In one embodiment, the polymer layer comprises poly(methyl methacrylate) (PMMA), poly(methyl glutarimide) (PMGI), phenol formaldehyde resin (DNQ/Novolac), SU-8, polyvinyl alcohol (PVA), SPR-220, ZEP-520, polydimethylsiloxane (PDMS), polyimide (Kapton), polyhydroxy styrene-based polymers, polyimides, poly(vinyl chloride) (PVC), or hydrogels.

In one embodiment, the metal-containing precursor is a DEZ metal-containing precursor. In one embodiment, the step of exposing the polymer layer comprises exposing the polymer layer to 12 cycles, with each cycle comprising: a 120 second DEZ exposure followed by a 120 second $H_2O$ exposure to form a hybrid ZnO-polymer layer. In one embodiment, the step of exposing the polymer layer occurs at approximately 95° C. and approximately 1 Torr, and wherein after the step of exposing the polymer layer, annealing at a temperature ranging between 200° C. and 1000° C. in an oxygen-rich atmosphere for at least 20 minutes. In one embodiment, the inorganic component is embedded to a depth of 300 nm to 500 nm into the polymer layer. In one embodiment, the metal electrode layer is formed underneath the hybrid oxide-polymer layer. In one embodiment, the step of patterning the polymer layer is conducted via electron beam exposure, photolithography (i.e. wet chemical etching) and polymer self-assembly processes, plasma etch, UV-ozone burn-off, or in a furnace with an oxygen-rich atmosphere.

In one embodiment, the metal electrode layer comprises interdigitated electrodes and p-type electrode to form a p-n junction. In one embodiment, the step of depositing the metal electrode layer comprises patterning the p-type electrode on the semiconductor substrate followed by patterning the interdigitated electrodes.

Another embodiment of the invention relates to an electro-optic device having a semiconductor substrate, a metal electrode layer on the semiconductor substrate, a dielectric barrier core layer within a gap of the metal electrode layer, a hybrid oxide-polymer layer covering the dielectric barrier core layer and partially covering the metal electrode layer. In one embodiment, the hybrid oxide-polymer layer comprises an inorganic component comprising at least one of aluminum oxide ($Al_2O_3$), titanium oxide ($TiO_2$), zinc oxide (ZnO), silicon dioxide ($SiO_2$), hafnium dioxide ($HfO_2$), zirconium dioxide ($ZrO_2$), magnesium oxide (MgO), tin oxide (SnO) and tungsten (W), infiltrated into a polymer layer comprising at least one of poly(methyl methacrylate) (PMMA), poly(methyl glutarimide) (PMGI), phenol formaldehyde resin (DNQ/Novolac), SU-8, polyvinyl alcohol (PVA), SPR-220, ZEP-520, polydimethylsiloxane (PDMS), polyimide (Kapton), polyhydroxystyrene-based polymers, polyimides, poly(vinyl chloride) (PVC), and hydrogels. In one embodiment, the inorganic component is embedded to a depth of 300 nm to 500 nm into the polymer layer. In one embodiment, the metal electrode layer is formed underneath the hybrid oxide-polymer layer. In one embodiment, the electro-optic device is a gas sensor or UV sensor. In one embodiment, the metal electrode layer comprises interdigitated electrodes. In one embodiment, the metal electrode layer comprises interdigitated electrodes and p-type electrode to form a p-n junction.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The disclosure will become more fully understood from the following detailed description, taken in conjunction with the accompanying figures, in which:

FIG. 2A is an image of the sensing structure before ion beam milling is used to form the dielectric barrier core; and FIG. 2B is an image of the sensing structure after ion beam milling.

FIG. 4A is a plot of I-V curves with (ON) and without (OFF) UV light illumination; and FIG. 4B shows emission spectra for the UV LED source light.

FIG. 5A is an image of the polymer-hybrid electro-optic device in an experimental gas chamber during testing; and FIG. 5B shows sensing data of the device upon exposure to 5 ppm of nitrous oxide ($NO_2$) (lower) and formaldehyde (HCHO) (upper). A voltage of 10V was used with a base current of 0.5 µA.

DETAILED DESCRIPTION

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

First Embodiment

Figure 1A:
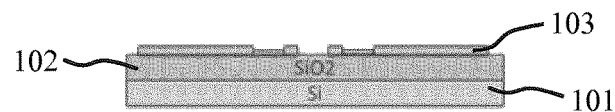
FIGS. 1A-1E depict a schematic of a method of fabricating a polymer-hybrid electro-optic device according to one embodiment.
Figure 1B:
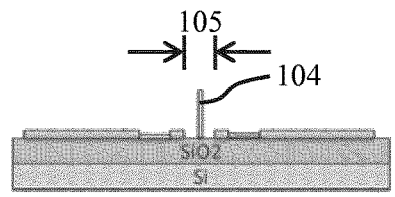
Figure 1C:
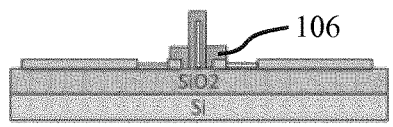
Figure 1D:
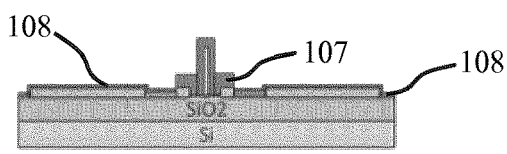
Figure 1E:
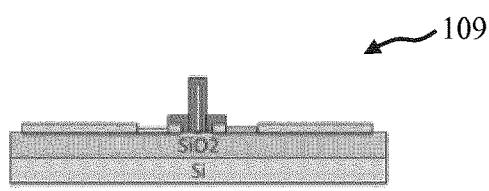

A method of fabricating a polymer-hybrid electro-optic device 109 is shown in the flowchart of FIGS. 1A-1E. The method of fabricating the polymer-hybrid electro-optic device 109 includes providing a semiconductor substrate 101 with an oxide layer 102 covering a top surface of semiconductor substrate 101. A metal electrode layer 103 is deposited and patterned onto the oxide layer 102 (FIG. 1A). Next, a dielectric barrier core layer 104 is deposited and patterned within a gap 105 of the metal electrode layer 103 (FIG. 1B). Subsequently, a polymer layer 106 is deposited and patterned to completely cover the dielectric barrier core layer 104 and partially covering the metal electrode layer 103 (FIG. 1C). Overlap with the metal electrode layer 103 establishes an effective electrical contact between the polymer layer 106 and the metal electrode layer 103. In FIG. 1D, the polymer layer 106 is infiltrated with an inorganic component to form a hybrid oxide-polymer layer 107. Excess inorganic component 108 may be deposited onto the oxide layer 102 of the semiconductor substrate 101, the metal electrode layer 103, or exposed portions of the semiconductor substrate 101. Finally, excess inorganic component 108 is removed from the semiconductor substrate 101 and metal electrode layer 103 (FIG. 1E) to form the polymer-hybrid electro-optic device 109.

The semiconductor substrate 101 is a silicon wafer. Alternatively, the semiconductor substrate 101 may also be comprised of silicon dioxide ($SiO_2$), aluminum oxide ($Al_2O_3$), sapphire, SiC, germanium, gallium arsenide (GaAs), alloys of silicon and germanium, indium phosphide (InP), or carbon-based substrate materials (i.e. graphene and diamond). The oxide layer 102 is silicon dioxide and may be grown and deposited on the top surface of semiconductor substrate 101 by PVD, PECVD, or CVD processes to a predetermined thickness. The metal electrode layer 103 may comprise interdigitated tungsten (W) or platinum (Pt), gold (Au), or other metallic, or semiconductor, electrodes separated with a gap on the order of several microns or less. Alternatively, the metal electrode layer 103 may also be comprised of indium tin oxide (ITO), Al-doped ZnO (AZO), Ga-doped ZnO (GZO), aluminum (Al), silver (Ag), ruthenium (Ru), rhodium (Rh), palladium (Pd), osmium (Os), and iridium (Ir).

Figure 2A:
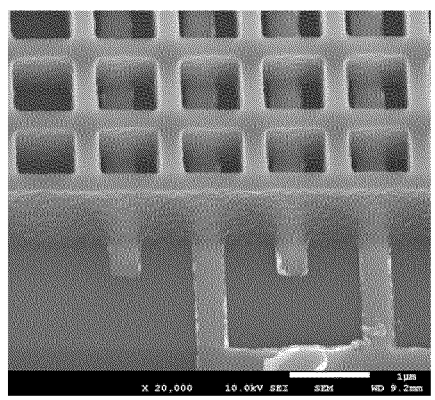
FIGS. 2A and 2B depict scanning electron micrographs of a sensing structure using interdigitated metal electrodes and a mesh structure with a dielectric barrier core. Specifically.
Figure 2B:
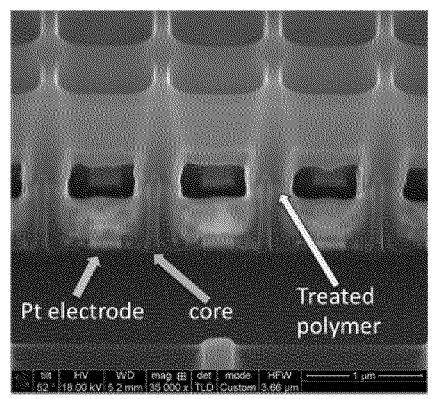

A critical aspect to polymer-hybrid electro-optic device 109 is the dielectric barrier core 104 within a gap 105 of the metal electrode layer 103. FIGS. 2A and 2B depict scanning electron micrographs of the sensing structure using interdigitated platinum electrodes and a mesh structure with a dielectric barrier core, the core being formed within a gap of the electrodes. The dielectric barrier core may be formed by lithographic techniques and development of a $SiO_2$ forming resist, or a three-step process where a dielectric film is deposited, an etch hard mask is patterned over the dielectric film, followed by an etch step to define the dielectric barrier core. Preferably, the dielectric barrier core 104 may be comprised of silicon dioxide; silicon nitride; silicon oxynitride; aluminum nitride; aluminum oxide; glass, such as silica glass or borosilicate glass; ceramic materials, such as $Ca_{0.7}Sr_{0.3}TiO_3$; high-K materials, such as $HfO_2$; ferroelectric materials, such as lead zirconium titanate (PZT); barium iron oxide (BFO); and thin enamel or polymer layers.

Figure 3:
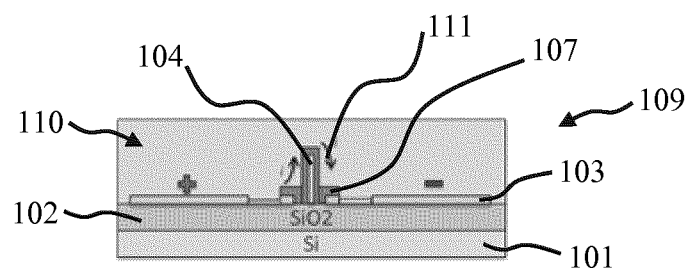
FIG. 3 depicts the electrical current detection mechanism for a polymer-hybrid electro-optic device according to one embodiment.

In sensing applications, the dielectric barrier core 104 forces electrical current 111 between the metal electrode layer 103 (i.e. interdigitated electrodes) to go up and over the hybrid oxide-polymer layer 107 and into the surrounding media 110, thus allowing detection of the electrical current 111 (FIG. 3). The surrounding media 110 may be gaseous, liquid or a soft solid. Additionally, including the dielectric barrier core 104 also allows for annealing the hybrid oxide-polymer layer 107 over 300° C. while retaining structural integrity and device functionality. Annealing at temperatures over 300° C. is important because the polymer-hybrid electro-optic device 109 detection capabilities become more sensitive to higher currents. Preferably, annealing temperatures may range between 200° C. and 1000° C.

The polymer layer 106 is applied via spin coating; however, other techniques may also be used. Next, a pattern may be formed in the polymer layer 106 by a variety of processes including: electron beam exposure, photolithography (i.e. wet chemical etching) and polymer self-assembly processes, plasma etch, UV-ozone burn-off, or in a furnace with an oxygen-rich atmosphere. In various embodiments, the desired features of the polymer layer 106 may include high-aspect ratio features. As used herein, the term high-aspect ratio refers to features having a depth to length and/or width of at least about 1:1. In particular embodiments, high-aspect ratio is between about 1:1 to about 3:1 and may be between about 1:1 and about 100:1 in still further embodiments. In certain embodiments, the polymer layer 106 is patterned to completely cover the dielectric barrier core 104 and partially cover the metal electrode layer 103. Preferably, the polymer layer 106 is patterned to enhance its surface area such that the amount of inorganic component, infiltrated in a subsequent step, increases to enhance photoluminescence properties of the resulting hybrid oxide-polymer layer 107.

As a material, the polymer is configured to retain enough bulk free volume and affinity to a metal-based precursor in the subsequent infiltration step. Thus, for example, the polymer layer 106 may be comprised of conventional resist materials (i.e. photoresists, deep-ultraviolet (DUV) resists, extreme-ultraviolet (EUV) resist materials), electron-beam resists materials, as well as block copolymer resist. The polymer layer 106, in particular embodiments, may be one or more of: poly(methyl methacrylate) (PMMA), poly(m-ethyl glutarimide) (PMGI), phenol formaldehyde resin (DNQ/Novolac), SU-8, polyvinyl alcohol (PVA), SPR-220, ZEP-520, polydimethylsiloxane (PDMS), polyimide (Kapton), polyhydroxystyrene-based polymers, polyimides and poly(vinyl chloride) (PVC), hydrogels, or any polymer with oxygen in its composition.

The hybrid oxide-polymer layer 107 is prepared by sequential infiltration synthesis (SIS). In general, the SIS process involves exposing the patterned polymer layer 106 to various gas phase precursors to synthesize protective components in situ. In an SIS process, gas phase precursors infiltrate into the free volume bulk of a polymer layer by diffusion transport mechanisms. Once the free volume bulk is saturated (i.e. the "percolation limit"), infiltration is complete and the gas phase precursors coat an exterior surface of the polymer layer. The gas phase precursors are selected for reaction with the polymer material. A wide range of precursors are available for selection for SIS modification which are capable of forming inorganic components within a variety of polymer materials. Examples of inorganic components prepared by SIS include aluminum oxide ($Al_2O_3$), titanium oxide ($TiO_2$), zinc oxide (ZnO), silicon dioxide ($SiO_2$), hafnium dioxide ($HfO_2$), zirconium dioxide ($ZrO_2$), magnesium oxide (MgO), tin oxide (SnO) or tungsten (W). In one embodiment, the hybrid oxide-polymer layer 107 may be formed by infiltration of a combination of inorganic components, such as $Al_2O_3$—ZnO—$Al_2O_3$ or SnO—ZnO—SnO—$TiO_2$, etc. Combinatorial infiltration may be used to take advantage of small differentials in band energy for charge separation or modification of chemical, optical, or electrical properties. Other metal oxides, metals, and other inorganic materials may also be prepared using SIS. For example, various known precursors utilized with atomic layer deposition (ALD) in preparation of layers of metal, metal oxide, metal nitride, metal silicide, and metal halide, ternary, and various multi-component metal-containing systems.

In various embodiments of the present methods, the SIS process uses a pair of precursors to form the inorganic component where one precursor comprises a metal or metal-containing compound selected to infiltrate into and react with the polymer material. The second precursor comprises a compound selected to react with the first precursor (or a portion thereof) bound to the surface and within the bulk of the polymer material. The protective component is accordingly synthesized on the surface and within the bulk of the polymer material by reaction of the first precursor and the second precursor. Although a wide range of precursors are suitable for SIS-modification, examples of various precursors include, but are not limited to: trimethyl aluminum (TMA), titanium tetrachloride ($TiCl_4$), diethyl zinc (DEZ), and tungsten hexafluoride ($WF_6$). The scope of available precursors and protective components for particular polymer materials may be further broadened by performing an initial SIS seed layer to form a metal or metal oxide layer reactive with other precursors. For example, an $Al_2O_3$ seed layer may be utilized to seed the growth of other inorganic materials which do not have direct selective chemistry with pure a PMMA-based polymer, i.e. ZnO, MgO, $SiO_2$, etc.

The second precursor is selected in view of the first precursor to carry out the SIS reaction within the polymer material to form the protective component. In various embodiments the second precursor may be an oxygen source (i.e. $H_2O$, $O_2$, $O_3$, $H_2O_2$), a reducing agent ($H_2$, $H_2S$, $H_2S_2$, $Si_2H_6$, etc.), or other compound reactive with the first precursor. One of skill in the art will appreciate that the order of the precursors may be altered in various embodiments and that the nomenclature 'first precursor' and 'second precursor' is used herein for ease of reference. For instance, in some embodiments the second precursor (i.e. $H_2O$, $H_2S$) can be selected to react with or bind to a specific functional group in the polymer material and utilized first in the SIS sequence, and the metal-containing precursor can be utilized next in the SIS sequence so as to react with the adsorbed or bound second precursor. One of skill in the art will further appreciate that various systems may comprise more than two precursors. The wide variety of polymer material/SIS precursor combinations make the process applicable to a virtually limitless number of polymer materials to which a broad range of protective components may be formed by SIS. Further, in some embodiments, more than one oxygen source and/or reducing source is used. For example, a third precursor comprising an oxygen source or a reducing agent different from the second precursor may be utilized.

The patterned polymer layer 106, i.e. SU-8, is modified through the SIS process which comprises a plurality of alternating exposures of the patterned SU-8 polymer layer 106 to a metal-based precursor compound, i.e. diethyl zinc (DEZ), which may be the first precursor, and a reactant precursor, i.e. $H_2O$, which may be the second precursor. Each precursor exposure results in a self-limited half-reaction with the SU-8 polymer layer. A purge step (i.e. $N_2$) may be performed following each precursor exposure to remove residual reactant. Exposures of each reactant can be performed in one step or in a series of two or more steps to control the amount of material that infiltrates the polymer. In this example, the exposures were carried out at a temperature of about 95° C. and a pressure of about 1 Torr. Lower pressures can be used, but at the expense of infiltration time and penetration depth into the polymer layer. Twelve SIS cycles were performed, with each cycle comprising: (1) a 120 second DEZ exposure having 8 to 11 pulses of DEZ; (2) a 40 second $N_2$ purge; (3) a 120 second $H_2O$ exposure having 8 to 11 pulses of $H_2O$; and (4) a 40 second $N_2$ purge. The number of cycles can range from 1 to over 24 or more. The precursor infiltration time can range from a few seconds to several minutes. The number of precursor pulses that can be injected into the chamber for each infiltration can range from 1 to over a dozen. The nitrogen purge time can range from a few seconds to several minutes. The SU-8 polymer domains are first modified chemically by reaction with DEZ, with the Zn of the DEZ bonding to the SU-8 polymer in a highly controllable fashion, owing to the stepwise molecule assembly process. The DEZ precursor infiltrates into the bulk of the SU-8 polymer. The second precursor, in this case water, completes the reaction with the Zn bonded to the surface and within the SU-8 polymer bulk, forming the ZnO inorganic component. The patterned polymer layer 106 was infiltrated by the inorganic component in the section of the polymer layer 106 over the metal electrode layer 103 such that the hybrid oxide-polymer layer 107 retains a conductive electrical characteristic.

In another aspect, the polymer layer 106 may be initially deposited, followed by modification through the SIS process, and then patterned to form the desired features.

After infiltrating the polymer layer 106 with inorganic components to form the hybrid oxide-polymer layer 107, the resultant structure is annealed at a temperature of at least 300° C., preferably 500° C., in an oxygen-rich atmosphere to ensure the infiltrated inorganic components are at a depth of between 300 nm to 500 nm into the hybrid oxide-polymer layer 107. Preferably, annealing after infiltration is performed in a furnace with an oxygen-rich atmosphere to minimize or prevent oxygen defects ($V_o$). Annealing at temperatures over 300° C. is important because the polymer-hybrid electro-optic device 109 detection capabilities become more sensitive to higher currents. Preferably, annealing temperatures may range between 200° C. and 1000° C. In one embodiment, the hybrid oxide-polymer layer 107 is annealed for 10 min to 120 min. Preferably, the hybrid oxide-polymer layer 107 is annealed for at least 20 minutes. Excess inorganic component 108 may be deposited onto the oxide layer 102 of the semiconductor substrate 101, the metal electrode layer 103, or exposed portions of the semiconductor substrate 101. This excess inorganic component 108 is removed from the semiconductor substrate 101 and metal electrode layer 103 to form the polymer-hybrid electro-optic device 109. Removal of the excess inorganic component 108 may be conducted using plasma etching or wet etching.

The device formed from the method described herein is an electro-optic device having a semiconductor substrate, a metal electrode layer 103 on the semiconductor substrate, a dielectric barrier core layer 104 within a gap 105 of the metal electrode layer 103, and a hybrid oxide-polymer layer 107 completely covering the dielectric barrier core layer 104 and partially covering the metal electrode layer 103. As already described herein, the hybrid oxide-polymer layer 107 comprises an inorganic component comprising at least one of aluminum oxide ($Al_2O_3$), titanium oxide ($TiO_2$), zinc oxide (ZnO), silicon dioxide ($SiO_2$), hafnium dioxide ($HfO_2$), zirconium dioxide ($ZrO_2$), magnesium oxide (MgO), tin oxide (SnO) and tungsten (W), infiltrated into a polymer layer 106 comprising at least one of poly(methyl methacrylate) (PMMA), poly(methyl glutarimide) (PMGI), phenol formaldehyde resin (DNQ/Novolac), SU-8, polyvinyl alcohol (PVA), SPR-220, ZEP-520, polydimethylsiloxane (PDMS), polyimide (Kapton), polyhydroxystyrene-based polymers, polyimides, poly(vinyl chloride) (PVC), hydrogels, and any polymer with oxygen in its composition.

In the current embodiment, the metal electrode layer 103 comprises interdigitated electrodes and is formed underneath the hybrid oxide-polymer layer 107. The inorganic component is embedded to a depth of 300 nm to 500 nm into the polymer layer. The electro-optic device is a gas sensor or UV sensor.

One particularly advantageous aspect of the invention is that the metal electrode layer is formed underneath the hybrid oxide-polymer layer. Conventional technologies, such as ZnO nanowire-, ZnO nanoparticle-, and ZnO thin film-based devices all require at least a top electrode atop the ZnO structure, thereby blocking UV light to the ZnO structure. The device produced by the methods disclosed herein eliminates this requirement by positioning the metal electrode layer formed underneath the hybrid oxide-polymer layer, thereby allowing more interaction of the light with the ZnO infiltrated into the polymer layer. Another advantageous aspect is that the device produced by the methods disclosed herein exhibits enhanced photoluminescence and spectral structure not found in bulk ZnO.

Another advantageous aspect of the method disclosed herein is that the polymer layer is patterned and then afterwards infiltrated with at least one inorganic component to tailor the optical or electrical properties of the final polymer-hybrid electro-optic device. Unlike bulk oxide (i.e. ZnO) films, which are known to be difficult to etch, polymer layers are easily patternable and allows for reduced manufacturing costs and resources. Furthermore, 3-D polymer patterning followed by the step of infiltration is not limited to polymer-hybrid electro-optic device fabrication; but rather, any kind of electro-optical application, unlike standard thin film technology.

Figure 4A:
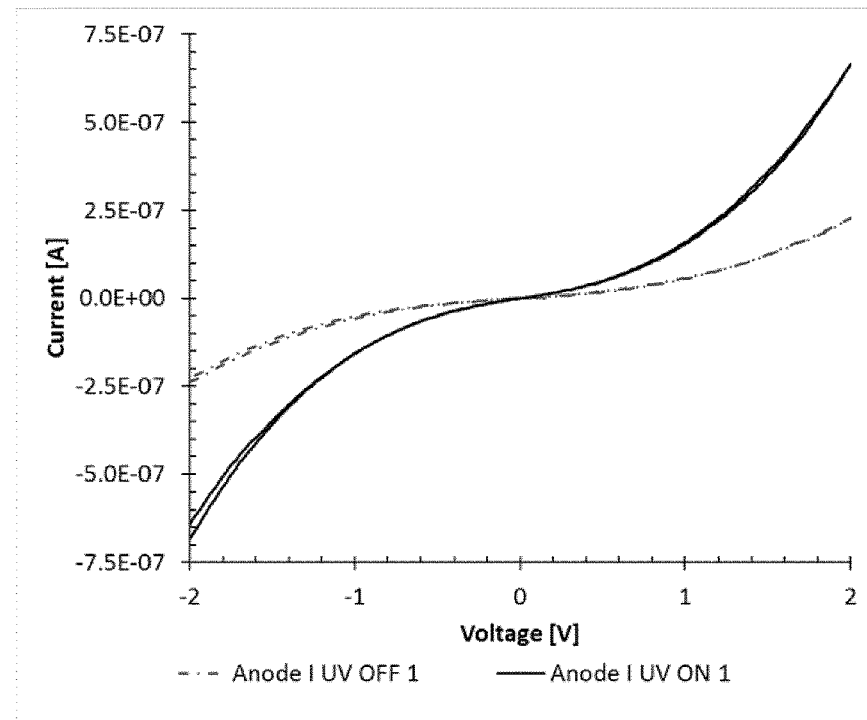
FIGS. 4A and 4B depict ultraviolet (UV) detection data for a polymer-hybrid electro-optic device according to one embodiment. Specifically.
Figure 4B:
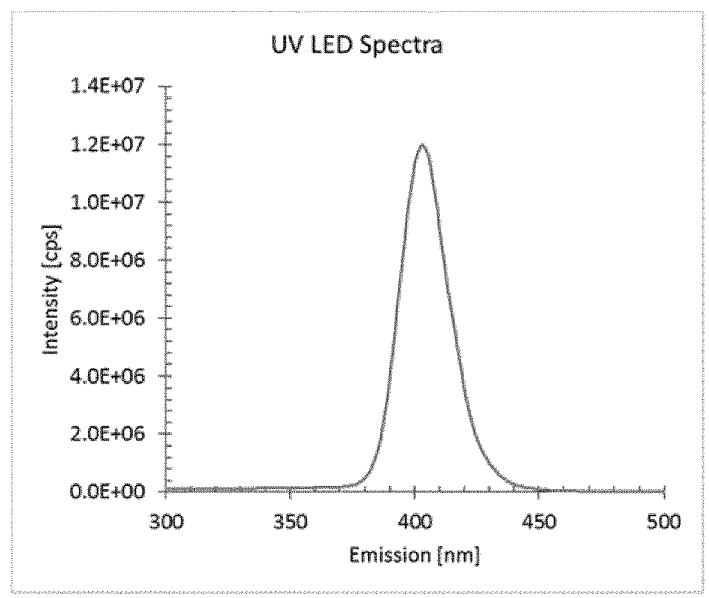
Figure 5A:
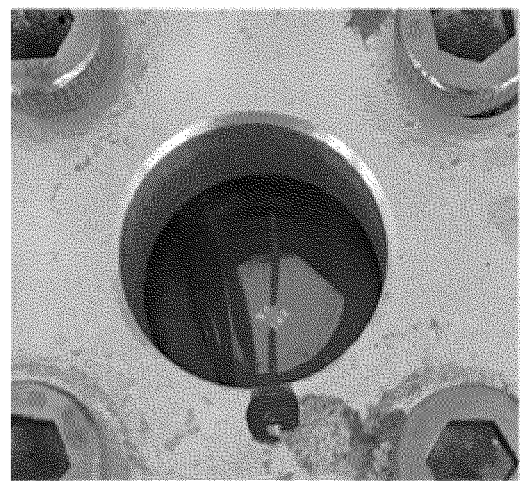
FIGS. 5A and 5B depict gas detection data for a polymer-hybrid electro-optic device according to one embodiment. Specifically.
Figure 5B:
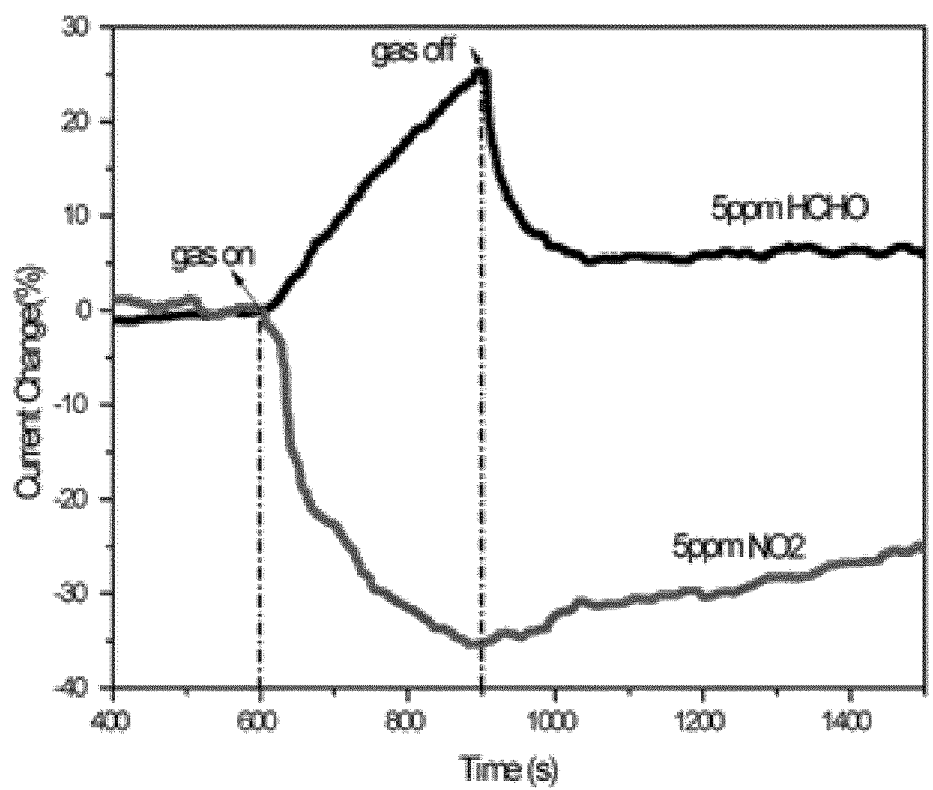

Data showing UV sensing and gas sensing results are depicted in shown in FIGS. 4A-5B. For the UV sensor, when a UV LED source light within an approximate range of 380 nm to 420 nm is used (FIG. 4B), I-V plots indicate that conductivity of the polymer-hybrid electro-optic device increased by more than three times in the presence of the UV LED light (ON) than when the UV LED light was not present (OFF) (FIG. 4A). For the gas sensor, FIG. 5A shows the experimental setup for gas detection tests conducted using a voltage of 10V and a base current of 0.5 µA. FIG. 5B shows a percent current change versus time plot representing detection characteristics of the gas sensor in the presence of 5 ppm of nitrous oxide ($NO_2$) (lower) and formaldehyde (HCHO) (upper). As the gas is allowed into the gas chamber at time equals 600 seconds, the gas sensor experiences a change in current, thereby detecting both nitrous oxide ($NO_2$) and formaldehyde (HCHO) at concentrations as low as 5 ppm. When each gas is turned off at time equals 800 seconds, the percent change in current approaches the baseline of 0 (when time equaled 0 to 600 seconds). Differences in steady state values between baseline and the percent change in current after the gases were turned off is most likely due to residual gas in the chamber. Thus, the data in FIGS. 4A and 5B show that the polymer-hybrid electro-optic device of the present invention may be used as a sensor, photonic device, or in other electro-optical applications.

Second Embodiment

Referring to FIGS. 6A-7B, a second embodiment of fabricating the polymer-hybrid electro-optic device is the same as the first embodiment, except that an additional step includes replacing one of the interdigitated electrodes with a p-type electrode to form a p-n junction.

Figure 6A:
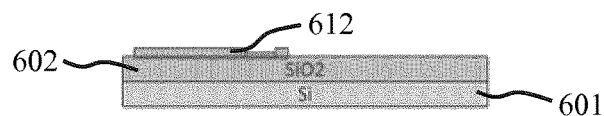
FIGS. 6A-6F depict a schematic of a method of fabricating a polymer-hybrid electro-optic device according to one embodiment.
Figure 6B:
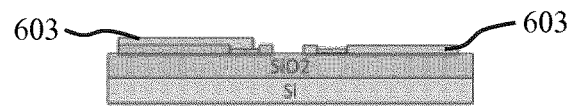
Figure 6C:
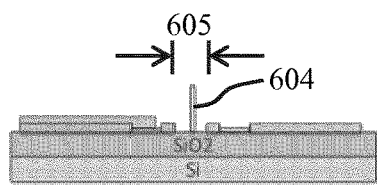
Figure 6D:
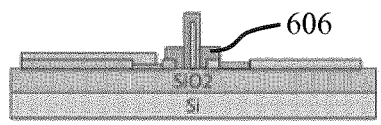
Figure 6E:
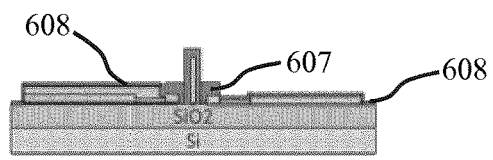
Figure 6F:
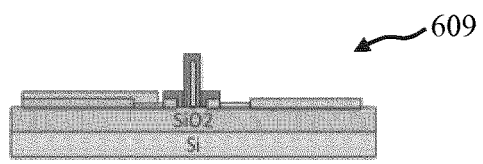

A method of fabricating a polymer-hybrid electro-optic device 609 is shown in the flowchart of FIGS. 6A-6F. The method of fabricating the polymer-hybrid electro-optic device 609 includes providing a semiconductor substrate 601 with an oxide layer 602 covering a top surface of semiconductor substrate 601 (FIG. 6A). A metal electrode layer 603 and 612 is deposited and patterned onto the oxide layer 602 (FIGS. 6A and 6B). The metal electrode layer 603 and 612 comprises interdigitated electrodes 603 and p-type electrode 612 to form a p-n junction. Next, a dielectric barrier core layer 604 is deposited and patterned within a gap 605 of the metal electrode layer 603 and 612 (FIG. 6C). Subsequently, a polymer layer 606 is deposited and patterned to completely cover the dielectric barrier core layer 604 and partially covering the p-type electrode 612 portion of the metal electrode layer 603 and 612 (FIG. 6D). In FIG. 6E, the polymer layer 606 is infiltrated with an inorganic component to form a hybrid oxide-polymer layer 607. Excess inorganic component 608 may be deposited onto the oxide layer 602 of the semiconductor substrate 601, the metal electrode layer 603 and 612, or exposed portions of the semiconductor substrate 601. Finally, excess inorganic component 608 is removed from the semiconductor substrate 601 and metal electrode layer 603 and 612 (FIG. 6F) to form the polymer-hybrid electro-optic device 609.

Figure 7A:
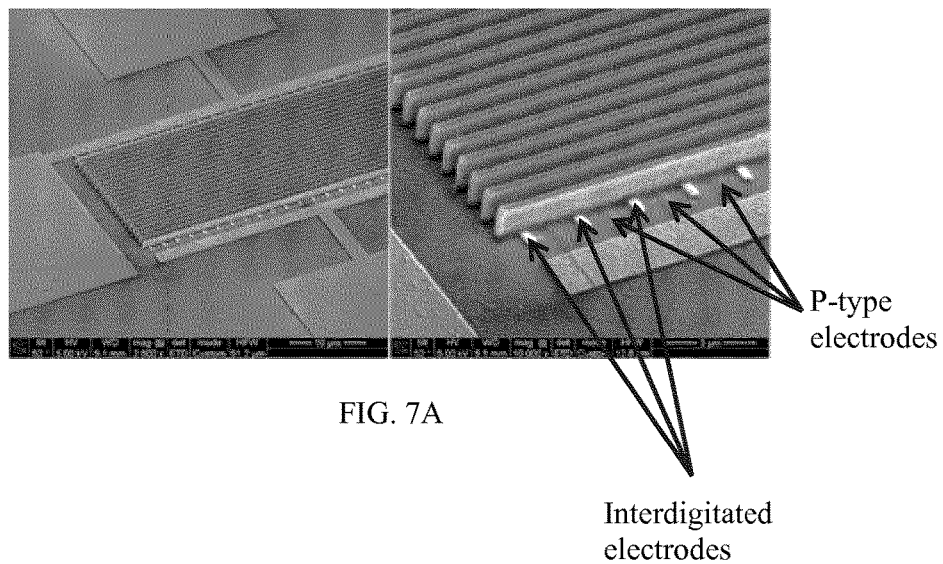
FIG. 7A depicts scanning electron micrographs of a sensing structure using interdigitated metal (Pt) electrodes and p-type (p-Si) electrodes (both labelled) to form p-n junctions.
Figure 7B:
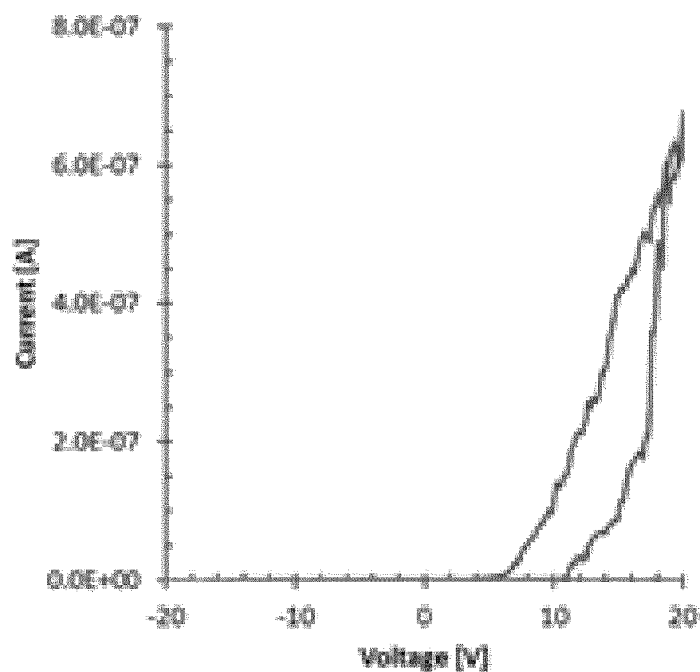
FIG. 7B is a plot of I-V curves of the polymer-hybrid electro-optic device.

The p-type electrode 612 is a boron (B) doped silicon (p-Si). Alternatively, the p-type electrode 612 may also be comprised of Si doped with aluminum (Al), nitrogen (N), gallium (Ga), or indium (In); gallium arsenide (GaAs) doped with beryllium (Be), zinc (Zn), chromium (Cr) (substituting Ga), Si, or germanium (Ge) (substituting As); cadmium telluride (CdTe) doped with phosphorus (P) (substituting Te), lithium (Li), or sodium (Na) (substituting Cd); and cadmium sulfide (CdS) doped with Li or Na (substituting Cd). Dopants may be added via diffusion or ion implantation processes. In one embodiment, the step of depositing the metal electrode layer 603 and 612 comprises patterning the p-type electrode 612 on the semiconductor substrate 601 followed by patterning the interdigitated electrodes 603. As shown in FIG. 7A, interdigitated metal (Pt) electrodes cover the p-type (p-Si) electrodes to ensure good electrical contact with minimum contact resistance. FIG. 7B depicts the current-voltage curve of the polymer-hybrid electro-optic device, as the voltage between electrodes is swept from −20 V to +20 V, and then back to −20 V. When the voltage is negative the ZnO—Pt p-n junction is in reverse bias and there is minimal current. When the voltage is positive the p-n junction is in forward bias and there is current flowing. This is because n-type ZnO is in contact with p-type boron-doped silicon electrode. Polymer-hybrid electro-optic devices exhibiting electrical characteristics as in FIG. 7B may be used in single photon emission, lasing, and sensing applications, for example.

Figure 8:
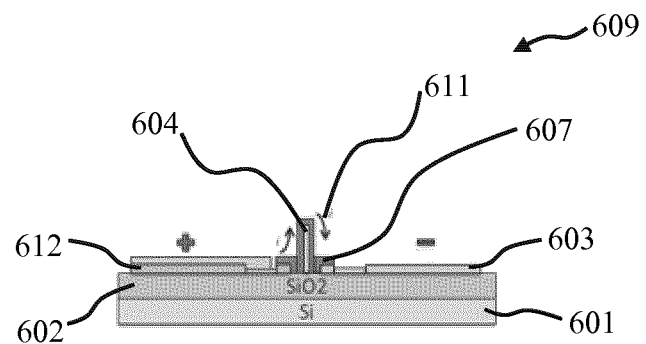
FIG. 8 depicts the electrical current detection mechanism for a polymer-hybrid electro-optic device according to one embodiment.

Adding the p-type electrode 612 serves to create a p-n junction with the infiltrated inorganic component. For example, in one embodiment, the inorganic component is ZnO, an n-type carrier. When the polymer-hybrid electro-optic device 609 is in forward bias (FIG. 8), emission of light is characteristic of the inorganic component (i.e. ZnO) bandgap or defect states in the inorganic component. Conventional technology used nanoparticles to achieve this phenomena and is limited in its application, as disclosed herein. This inventions demonstrates a novel approach for fabricating a lithographically defined p-n junction.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

References herein to the positions of elements (i.e. "top," "bottom," "above," "below," "on," etc.) are merely used to describe the orientation of various elements in the FIGURES. It should be noted that the orientation of various elements may differ according to other exemplary embodiments, and that such variations are intended to be encompassed by the present disclosure.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

What is claimed:
1. A method of fabricating an electro-optic device, the method comprising:
(a) providing a semiconductor substrate;
(b) depositing a metal electrode layer on the semiconductor substrate;
(c) depositing a dielectric barrier core layer within a gap of the metal electrode layer;

(d) patterning a polymer layer to cover the dielectric barrier core layer and partially covering the metal electrode layer;

(e) infiltrating the polymer layer with an inorganic component to form a hybrid oxide-polymer layer; and (f) removing excess inorganic component from the semiconductor substrate and metal electrode layer.

2. The method of claim 1, further comprising, following the step of infiltrating, annealing the hybrid oxide-polymer layer in an oxygen-rich atmosphere.

3. The method of claim 1, wherein the step of infiltrating comprises exposing the polymer layer to at least one cycle of a metal-containing precursor followed by a second precursor.

4. The method of claim 3, wherein the metal-containing precursor comprises trimethyl aluminum (TMA), titanium tetrachloride ($TiCl_4$), diethyl zinc (DEZ), or tungsten hexafluoride ($WF_6$).

5. The method of claim 3, wherein the second precursor comprises an oxygen source, the oxygen source comprising $H_2O$, $O_2$, $O_3$, or $H_2O_2$.

6. The method of claim 3, wherein the second precursor comprises a reducing agent, the reducing agent comprising $H_2$, $H_2S$, $H_2S_2$, or $Si_2H_6$.

7. The method of claim 1, wherein the inorganic component comprises aluminum oxide ($Al_2O_3$), titanium oxide ($TiO_2$), zinc oxide (ZnO), silicon dioxide ($SiO_2$), hafnium dioxide ($HfO_2$), zirconium dioxide ($ZrO_2$), magnesium oxide (MgO), tin oxide (SnO) or tungsten (W).

8. The method of claim 1, wherein the polymer layer comprises poly(methyl methacrylate) (PMMA), poly(methyl glutarimide) (PMGI), phenol formaldehyde resin (DNQ/Novolac), SU-8, polyvinyl alcohol (PVA), SPR-220, ZEP-520, polydimethylsiloxane (PDMS), polyimide (Kapton), polyhydroxystyrene-based polymers, polyimides, poly(vinyl chloride) (PVC), or hydrogels.

9. The method of claim 3, wherein the step of exposing the polymer layer comprises exposing the polymer layer to 12 cycles, with each cycle comprising: a 120 second DEZ exposure followed by a 120 second $H_2O$ exposure to form a hybrid ZnO-polymer layer.

10. The method of claim 9, wherein the step of exposing the polymer layer occurs at approximately 95° C. and approximately 1 Torr, and wherein after the step of exposing the polymer layer, annealing at a temperature ranging between 200° C. and 1000° C. in an oxygen-rich atmosphere for at least 20 minutes.

11. The method of claim 1, wherein the inorganic component is embedded to a depth of 300 nm to 500 nm into the polymer layer.

12. The method of claim 1, wherein the metal electrode layer is formed underneath the hybrid oxide-polymer layer.

13. The method of claim 1, wherein the step of patterning the polymer layer is conducted via electron beam exposure, photolithography (i.e. wet chemical etching) and polymer self-assembly processes, plasma etch, UV-ozone burn-off, or in a furnace with an oxygen-rich atmosphere.

14. The method of claim 1, wherein the metal electrode layer comprises interdigitated electrodes and p-type electrode to form a p-n junction.

15. The method of claim 14, wherein the step of depositing the metal electrode layer comprises patterning the p-type electrode on the semiconductor substrate followed by patterning the interdigitated electrodes.

* * * * *